(12) United States Patent
Kulkarni et al.

(10) Patent No.: US 10,453,799 B2
(45) Date of Patent: Oct. 22, 2019

(54) LOGIC DIE AND OTHER COMPONENTS EMBEDDED IN BUILD-UP LAYERS

(71) Applicant: INTEL CORPORATION, Santa Clara, CA (US)

(72) Inventors: Deepak V. Kulkarni, Chandler, AZ (US); Russell K. Mortensen, Chandler, AZ (US); John S. Guzek, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/346,568

(22) Filed: Nov. 8, 2016

(65) Prior Publication Data

US 2017/0125351 A1    May 4, 2017

Related U.S. Application Data

(63) Continuation of application No. 13/684,110, filed on Nov. 21, 2012, now Pat. No. 9,496,211.

(51) Int. Cl.
*H01L 23/538* (2006.01)
*H01L 21/50* (2006.01)
(Continued)

(52) U.S. Cl.
CPC ...... *H01L 23/5389* (2013.01); *H01L 21/4857* (2013.01); *H01L 21/50* (2013.01);
(Continued)

(58) Field of Classification Search
CPC ............ H01L 23/5383; H01L 23/5385; H01L 23/485; H01L 23/5389; H01L 25/0657;
(Continued)

(56) References Cited

U.S. PATENT DOCUMENTS 5,227,013 A    7/1993    Kumar
8,035,216 B2  10/2011   Skeete
(Continued)

FOREIGN PATENT DOCUMENTS

JP   2001-230515 A   8/2001
JP   2002-270712 A   9/2002
(Continued)

OTHER PUBLICATIONS

Machine translation of JP2007-294611, translated Sep. 27, 2018 (Year: 2018).*

(Continued)

*Primary Examiner* — Selim U Ahmed
*Assistant Examiner* — Evan G Clinton
(74) *Attorney, Agent, or Firm* — Schwabe, Williamson & Wyatt, P.C.

(57) ABSTRACT

Embodiments of the present disclosure are directed towards package assemblies, as well as methods for forming package assemblies and systems incorporating package assemblies. A package assembly may include a substrate including a plurality of build-up layers, such as bumpless build-up layer (BBUL). In various embodiments, electrical routing features may be disposed on an outer surface of the substrate. In various embodiments, a primary logic die and a second die or capacitor may be embedded in the plurality of build-up layers. In various embodiments, an electrical path may be defined in the plurality of build-up layers to route electrical power or a ground signal between the second die or capacitor and the electrical routing features, bypassing the primary logic die.

15 Claims, 8 Drawing Sheets

(51) Int. Cl.

| | |
|---|---|
| *H01L 23/498* | (2006.01) |
| *H01L 23/00* | (2006.01) |
| *H01L 21/48* | (2006.01) |
| *H01L 21/768* | (2006.01) |
| *H01L 23/48* | (2006.01) |
| *H01L 23/485* | (2006.01) |
| *H01L 25/065* | (2006.01) |
| *H01L 25/16* | (2006.01) |
| *H01L 25/00* | (2006.01) |
| *H01L 49/02* | (2006.01) |

(52) U.S. Cl.
CPC ...... *H01L 21/76898* (2013.01); *H01L 23/481* (2013.01); *H01L 23/485* (2013.01); *H01L 23/49816* (2013.01); *H01L 23/49822* (2013.01); *H01L 23/49827* (2013.01); *H01L 23/5383* (2013.01); *H01L 23/5386* (2013.01); *H01L 24/19* (2013.01); *H01L 25/0657* (2013.01); *H01L 25/16* (2013.01); *H01L 25/50* (2013.01); *H01L 28/40* (2013.01); *H01L 2224/0401* (2013.01); *H01L 2224/04105* (2013.01); *H01L 2224/16145* (2013.01); *H01L 2224/16146* (2013.01); *H01L 2224/73209* (2013.01); *H01L 2224/73259* (2013.01); *H01L 2224/81005* (2013.01); *H01L 2224/92133* (2013.01); *H01L 2224/92224* (2013.01); *H01L 2225/06541* (2013.01); *H01L 2225/06548* (2013.01); *H01L 2924/07811* (2013.01); *H01L 2924/12042* (2013.01); *H01L 2924/18161* (2013.01); *H01L 2924/18162* (2013.01); *H01L 2924/19041* (2013.01); *H01L 2924/19104* (2013.01); *H01L 2924/19105* (2013.01)

(58) Field of Classification Search
CPC ......... H01L 25/50; H01L 2224/24145–24147; H01L 2224/24051
See application file for complete search history.

(56) References Cited

U.S. PATENT DOCUMENTS

| 8,093,704 | B2 | 1/2012 | Palmer et al. |
| 2005/0124148 | A1 | 6/2005 | Tuominen |
| 2006/0049995 | A1 | 3/2006 | Imaoka et al. |
| 2007/0013080 | A1 | 1/2007 | Dibene et al. |
| 2008/0302563 | A1* | 12/2008 | Ohsumi ............ H01L 23/49816 174/263 |
| 2009/0072382 | A1 | 3/2009 | Guzek |
| 2009/0188707 | A1 | 7/2009 | van den Hoek et al. |
| 2009/0290317 | A1 | 11/2009 | Mashino |
| 2010/0061056 | A1 | 3/2010 | Searls et al. |
| 2010/0290191 | A1 | 11/2010 | Lin et al. |
| 2011/0024906 | A1 | 2/2011 | Meyer et al. |
| 2011/0089573 | A1* | 4/2011 | Kurita ................ H01L 23/3121 257/774 |
| 2011/0156231 | A1 | 6/2011 | Guzek |
| 2012/0049382 | A1 | 3/2012 | Malatkar |
| 2012/0056316 | A1 | 3/2012 | Pagaila et al. |
| 2012/0074580 | A1 | 3/2012 | Nalla et al. |
| 2012/0074581 | A1 | 3/2012 | Guzek et al. |
| 2012/0113704 | A1 | 5/2012 | Dattaguru et al. |
| 2012/0153494 | A1 | 6/2012 | Manepalli et al. |
| 2012/0161316 | A1 | 6/2012 | Gonzalez et al. |
| 2012/0161331 | A1* | 6/2012 | Gonzalez ............ H01L 23/5389 257/774 |
| 2012/0306068 | A1* | 12/2012 | Saito .................. H01L 23/3114 257/734 |

FOREIGN PATENT DOCUMENTS

| JP | 2007294611 A | * 11/2007 | ............ H01L 24/97 |
| JP | 2009-289908 A | 12/2009 | |
| JP | 2011-086767 A | 4/2011 | |
| KR | 10-2011-0039396 A | 4/2011 | |
| KR | 10-2012-0011076 A | 2/2012 | |

OTHER PUBLICATIONS

Shimpi, "The Future of CPU Packaging: Intel's BBUL" AnandTech.com, Oct. 8, 2001.
Gruener, "Intel delays BBUL process package", Tom's Hardware US, Jan. 13, 2005.
International Search Report for International Application No. PCT/US2013/048355, dated Oct. 18, 2013.
Search and Examination Report, issued in GB Patent Application No. 1320552.1, dated Apr. 28, 2014, 5 pages.
Office Action issued in corresponding Japanese Patent Application No. 2013-236734, dated Dec. 16, 2014, 7 pages.
Notice of Preliminary Rejection dated Mar. 25, 2015, issued in corresponding Korean Patent Application No. 2013-0141704, 18 pages.
International Preliminary Report on Patentability dated Jun. 4, 2015, issued in corresponding International Application No. PCT/US2013/048355, 9 pages.
The Final Notice of Preliminary Rejection dated Oct. 27, 2015, issued in corresponding Korean Patent Application No. 2013-0141704, 12 pages.
Decision to Refuse dated Oct. 13, 2015, issued in corresponding Japanese Patent Application No. 2013-236734, 4 pages.
Shimpi, Anand Lal, "The Future of CPU Packaging: Intel's BBUL," AnandTech.com, Oct. 22, 2012, 5 pages.
Gruener, Wolfgang, "Intel delays BBUL processor package," AMD Accelerated Processors, Tom's Hardware US, website—www.tomshardware.com/news/intel-delays-bbul-processor-package,546.html, Oct. 22, 2012, 3 pages, Chicago, IL.
Office Action dated Nov. 22, 2016 for Japanese Patent Application No. 2016-011536, 8 pages.
Non-Final Office Action dated Mar. 26, 2014 for U.S. Appl. No. 13/684,110, 26 pages.
Final Office Action dated Aug. 4, 2014 for U.S. Appl. No. 13/684,110, 19 pages.
Non-Final Office Action dated Mar. 4, 2015 for U.S. Appl. No. 13/684,110, 14 pages.
Final Office Action dated Jul. 23, 2015 for U.S. Appl. No. 13/684,110, 20 pages.
Non-Final Office Action dated Mar. 23, 2016 for U.S. Appl. No. 13/684,110, 21 pages.
Notice of Allowance dated Jul. 15, 2016 for U.S. Appl. No. 13/684,110, 11 pages.

* cited by examiner

LOGIC DIE AND OTHER COMPONENTS EMBEDDED IN BUILD-UP LAYERS

RELATED APPLICATION

This application is a continuation of, and claims priority to, U.S. patent application Ser. No. 13/684,110, entitled "LOGIC DIE AND OTHER COMPONENTS EMBEDDED IN BUILD-UP LAYERS," filed on Nov. 21, 2012. The Specification of application Ser. No. 13/684,110 is hereby fully incorporated by reference.

FIELD

Embodiments of the present disclosure generally relate to the field of integrated circuits, and more particularly, to techniques and configurations for a package assembly with a logic die and other components embedded in a plurality of build-up layers.

BACKGROUND

Emerging package assemblies may include multiple dies in various stacked and/or embedded configurations. The package assemblies may continue to shrink to smaller dimensions to provide a smaller form factor for various applications including, for example, mobile computing devices such as phones or tablets. The routing of electrical signals through the package assembly for each of the multiple dies is challenging for current package assembly configurations as the dies and the package assembly shrink to smaller dimensions. For example, present techniques may utilize stringent design rules that push the limits of pitch of interconnect structures such as trace width/spacing or may utilize routing techniques that may compromise reliability of one or more of the multiple dies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
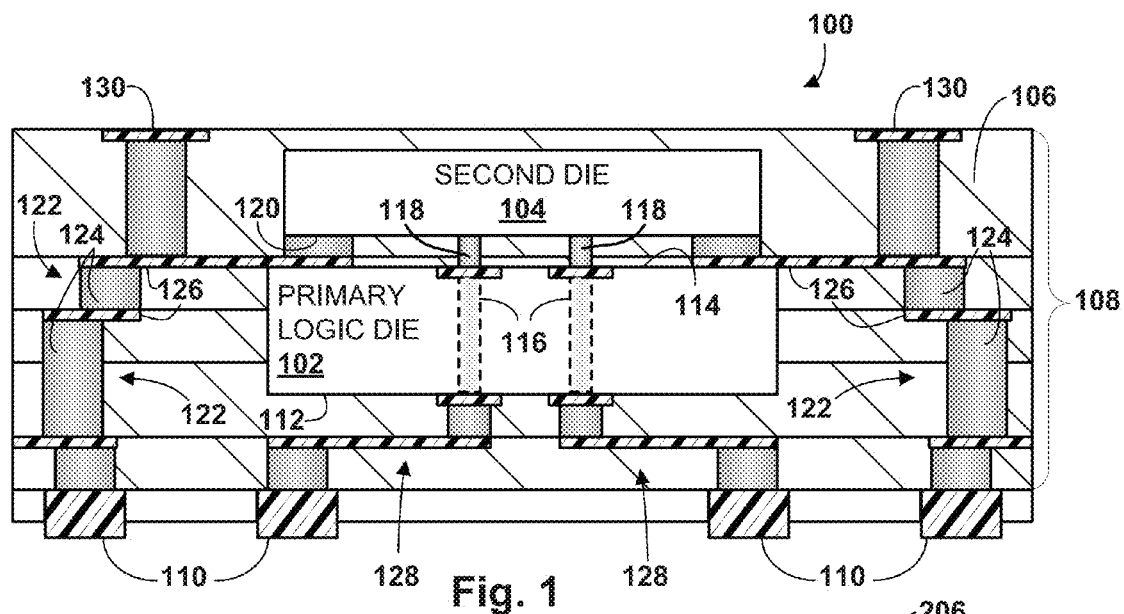
FIG. 1 illustrates a cross-section side view of an example package assembly including a primary logic die and a secondary die embedded in a plurality of build-up layers, in accordance with various embodiments.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 schematically illustrates a cross-section side view of an example package assembly 100 including a primary logic die 102 and a second die 104 embedded in a substrate 106. In various embodiments, substrate 106 may include a plurality of build-up layers 108 in which other components are embedded. In some embodiments, plurality of build-up layers may include a plurality of "bumpless" build-up layers ("BBUL"). As used herein, "bumpless build-up layers" may refer to layers of substrate and components embedded therein without the use of solder or other attaching means that may be considered "bumps."

In various embodiments, primary logic die 102 may be a processor core with transistors and other components that together may form all or part of the "brain" of a computing device in which package assembly 100 is installed. In various embodiments, second die 104 may be a secondary logic die (e.g., another processor core) configured to supplement the processing power of primary logic die. In various other embodiments, second die 104 may be any type of die that may be included on package assembly 100 to simplify a system/platform into which package assembly 100 is installed, such as a memory die or a power management die.

An electrical routing feature 110 may be disposed on a surface of substrate 106. In various embodiments, electrical routing feature 110 may include a ball grid array ("BGA") or other electrical components that may route electrical signals to/from primary logic die 102 and/or second die 104 to other components not depicted in FIG. 1, such as a printed circuit board ("PCB") to which package assembly 100 is attached.

Primary logic die 102 may include a first, "active" surface 112 and a second opposing surface 114. Primary logic die 102 may also include one or more vias such as, for example, through-silicon vias ("TSVs") 116, between first surface 112 and second surface 114. While two TSVs 116 are shown in FIG. 1, this is not meant to be limiting, and more or less TSVs 116 may be included. Although vias in the drawings are shown as having uniformly straight sides, vias may have other shapes as well. For example, vias drilled by lasers may tend to have tapered shapes, e.g., with one end being larger than the opposite end.

In various embodiments, an electrical path 118 may be formed in plurality of build-up layers 108 from an active surface 120 of second die 104 to TSVs 116 of primary logic die 102. In various embodiments, electrical path 118 may route input/output ("I/O") signals between primary logic die 102 and second die 104. Other electrical signals to or from second die 104, such as electrical power and/or ground signals, may be routed directly to electrical routing features 110 by way of a second electrical path 122. In various embodiments, second electrical path 122 may include one or more vias 124 that interconnect one or more conductive layers 126 disposed between layers of plurality of build-up layers 108.

In various embodiments, second electrical path 122 may not pass through primary logic die 102, which may allow reduction of design restrictions of primary logic die 102. For example, primary logic die 102 may require less THVs 116. This may conserve space on primary logic die 102 for other technical features, increase reliability of primary logic die 102, and/or enable primary logic die 102 to be smaller. A smaller primary logic die 102 may enable other components to be made smaller as well, reducing an overall size of package assembly 100. A reduced-size package assembly 100 may in turn enable creation of smaller computing devices, such as smart phones and tablet computers.

In various embodiments, primary logic die 102 may be embedded in plurality of build-up layers 108 in-between second die 104 and electrical routing features 110. In some such embodiments, second electrical path 122 may include at least one conductive layer 126 between two of the plurality of build-up layers 108 to route electrical power or a ground signal that passes between second die 104 and electrical routing features 110 away from primary logic die 102. An example of this is shown in FIG. 1 to the right and left of primary logic die 102, where vias 124 and conductive layers 126 are defined in plurality of build-up layers 108 in a manner that "fans out" from primary logic die 102 as second electrical path 122 moves downward along the page. In other embodiments, second electrical path 122 may not fan ground signals and power away from primary logic die 102 the entire way from second die 104 to electrical routing features 110.

In various embodiments, a third electrical path 128 may be defined in plurality of build-up layers 108 between first surface 112 of primary logic die 102 and electrical routing features 110. In various embodiments, third electrical path 128 may route electrical signals (e.g., I/O, ground, power) between primary logic die 102 and other components not depicted in FIG. 1 such as, for example a circuit board (e.g., printed circuit board 1602 of FIG. 16). In various embodiments, first electrical path 118, second electrical path 122, and/or third electrical path 128 may not include solder, as they may be fabricated with other components using a BBUL process.

In various embodiments, package assembly 100 may include a package-on-package ("POP") pad 130. In various embodiments, POP pad 130 may be disposed on a surface of package assembly 100, such as a top surface, to route electrical signals between package assembly 100 and other packages (not shown) that may be stacked on package assembly 100. However, this is not required, and examples of other package assemblies without POP pads are described herein.

Figure 2:
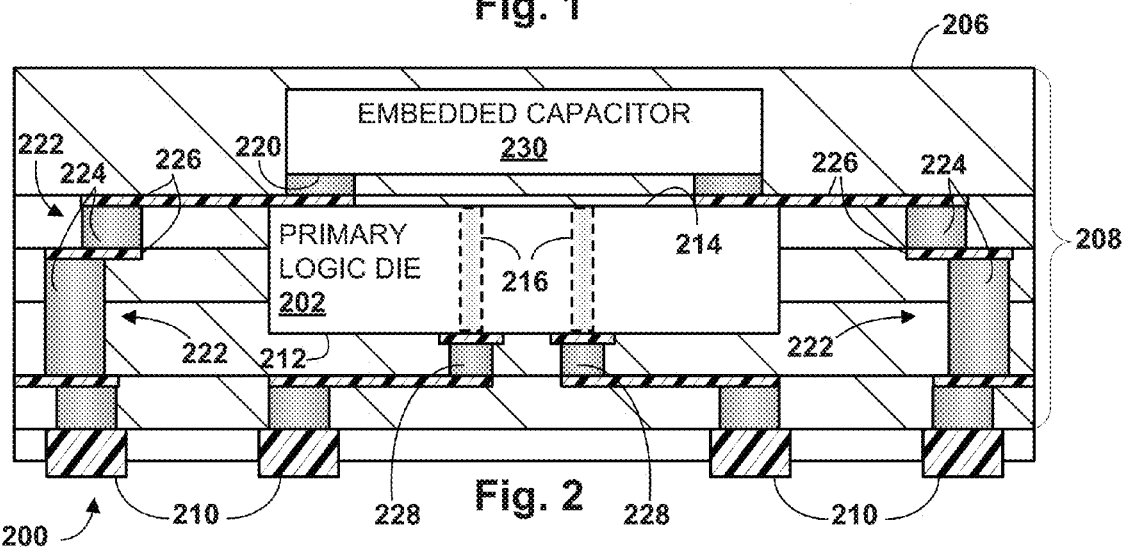
FIG. 2 illustrates a cross-section side view of an example package assembly including a primary logic die and a capacitor embedded in a plurality of build-up layers, in accordance with various embodiments.

FIG. 2 depicts a package assembly 200 with many of the same components as FIG. 1, which are numbered in a similar manner. In this example, however, instead of second die 104 (e.g., a logic, memory or power management die), a capacitor 230 (or an array of capacitors) is embedded in plurality of build-up layers 208. In various embodiments, capacitor 230 may be a decoupling capacitor positioned in proximity to primary logic die 202 in order to reduce noise. Embedding capacitors such as capacitor 230 in package assembly 200 may allow for placement of less capacitors on a PCB such as a motherboard, e.g., reducing its footprint.

Figure 3:
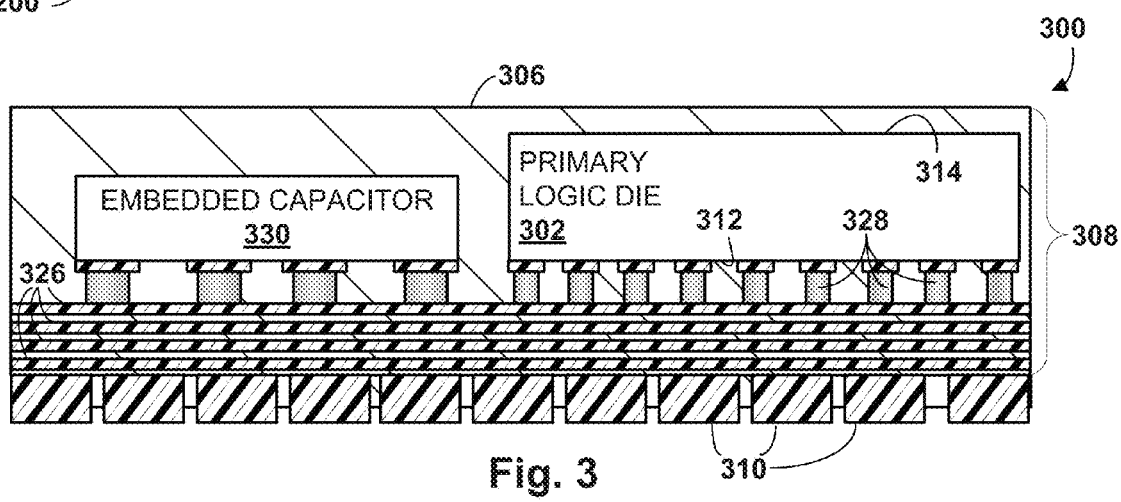
FIG. 3 illustrates a cross-section side view of an example package assembly including a primary logic die and a capacitor embedded side-by-side in a plurality of build-up layers, in accordance with various embodiments.

FIG. 3 depicts another embodiment of a package assembly 300 similar to package assembly 200 of FIG. 2. Components that correspond to components in FIGS. 1 and 2 are labeled similarly. However, in FIG. 3, capacitor 330 is embedded laterally offset from and approximately coplanar with primary logic die 302, as opposed to being disposed on an opposite side of primary logic die 302 from electrical routing features 310 as depicted in FIG. 2. Additionally, the electrical path from embedded capacitor 330 to electrical routing elements 310 may include more conductive layers 326 than depicted in connection with FIG. 1 or 2, although this is not meant to be limiting. More or less conductive layers (126, 226, 326) may be included in package assemblies in various embodiments. In various embodiments, more conductive layers may enable better power delivery.

Figure 4:
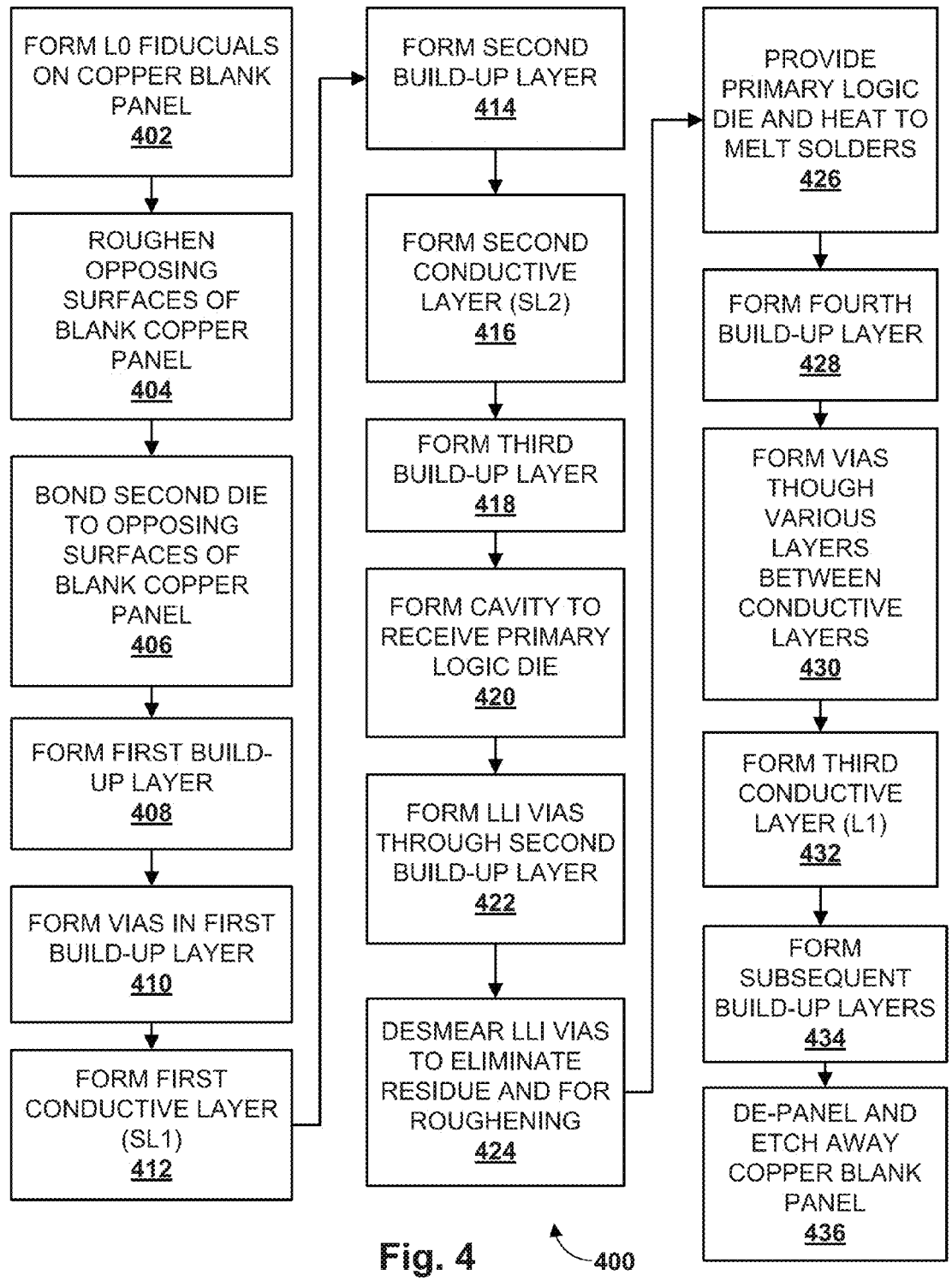
FIG. 4 schematically illustrates a flow diagram for a method of fabricating a package assembly, in accordance with some embodiments.

FIG. 4 schematically depicts an example fabricating process flow 400. FIGS. 5-15 depict an example package assembly 500 in various stages of fabrication that correspond to points in fabricating process flow 400. Accordingly, as process flow 400 is described, reference will be made to corresponding stages in FIGS. 5-15.

Figure 5:
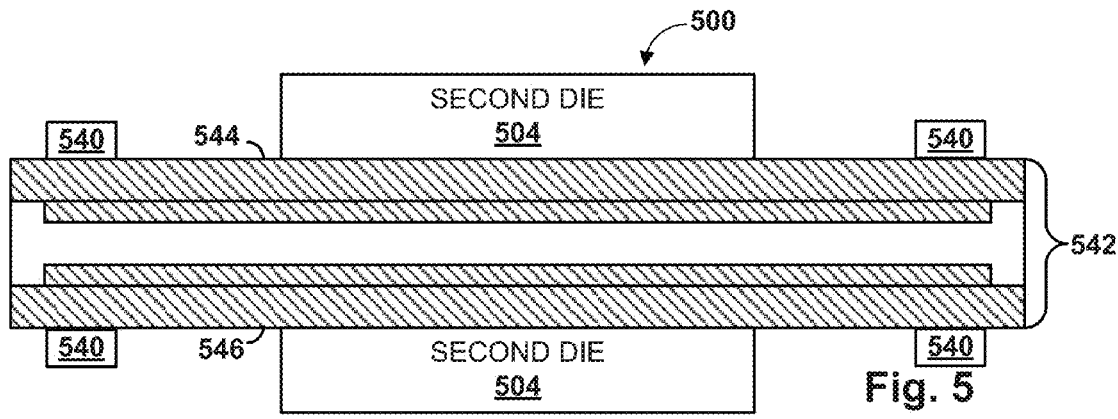
FIGS. 5-15 schematically illustrate various stages of package assembly fabrication, in accordance with various embodiments.

With reference to FIGS. 4 and 5, at block 402, structures referred to as "L0 fiducials" 540 may be formed (e.g., patterned and plated) on a blank panel 542. In various embodiments, fiducials 540 may be copper-plated features included for alignment purposes. In many cases, they may be removed during various steps of fabrication, such as depaneling, so that they do not become part of the final package assembly 500.

In various embodiments, blank panel 542 may be a peelable core, and may be constructed with various materials, such as copper (Cu). At block 404, a first surface 544 and a second surface 546 of copper blank panel 542 may be roughened in preparation for receiving dielectric film, e.g., Ajinomoto build-up film, or "ABF," lamination. At block 406, a second die 504 may be bonded to first surface 544 and second surface 546 of copper blank panel 542. A primary logic die 502 will be added later. FIG. 5 depicts what will become two package assemblies 500 (one on each side of copper blank panel 542) at this stage of fabrication.

Figure 6:
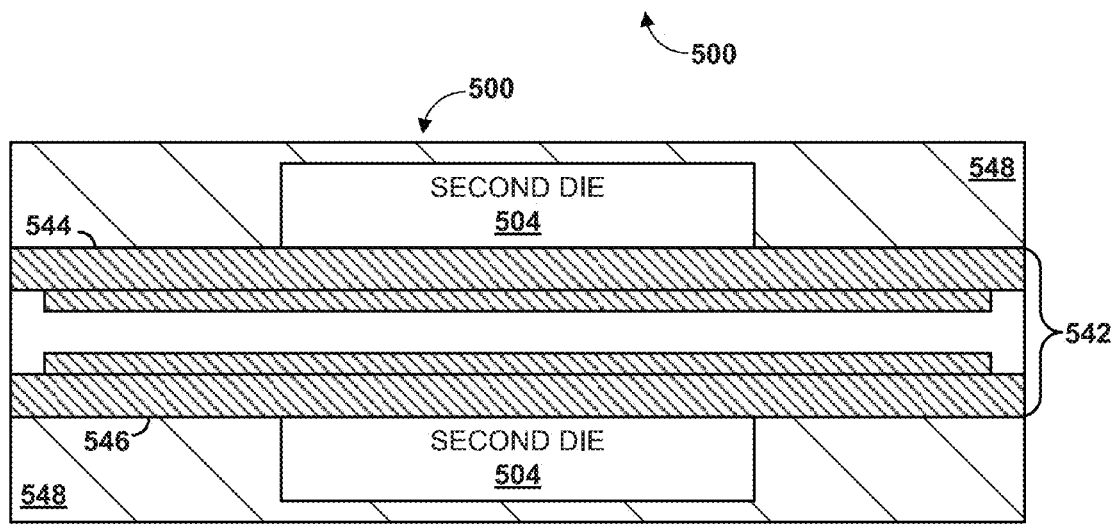

At block 408, a first build-up layer 548 may be formed (e.g., added and cured) on each side and cured to embed second die 504, in ABF laminate. An example of package assembly 500 at this stage is depicted in FIG. 6. In various embodiments, first build-up layer 548 and other build-up layers described herein may have material properties that may be altered and/or optimized for reliability, warpage reduction, and so forth.

Figure 7:
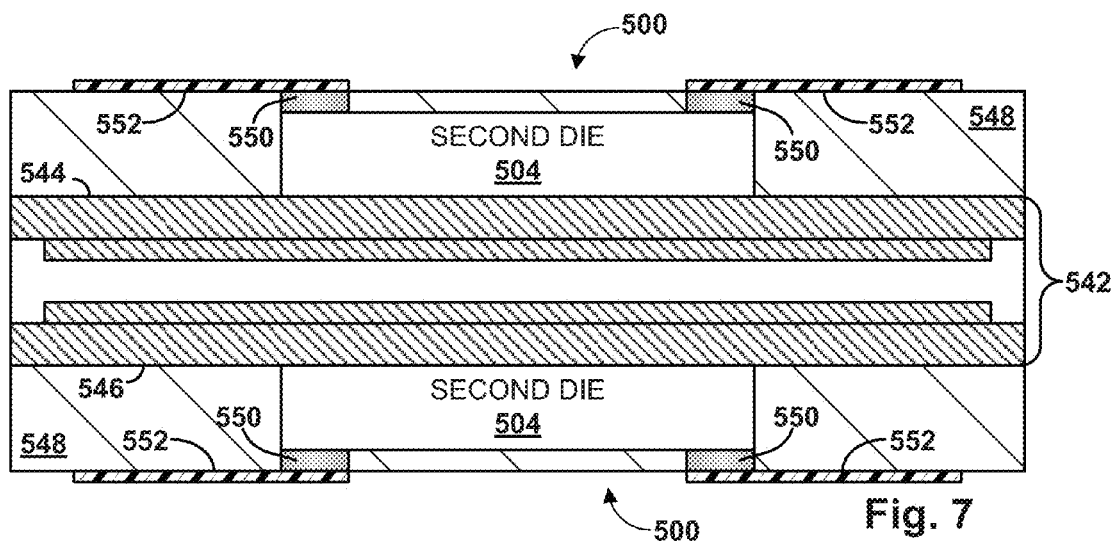

At block 410, vias 550 may be formed in first build-up layer 548, e.g., on top of I/O pads (not shown) and/or power ground pads (not shown) of second die 504. In various embodiments, a laser such as, for example, an ultraviolet and/or carbon dioxide laser, may be used to drill vias 550. At block 412, a first conductive layer 552, which may be referred to herein as "SL1," may be formed (e.g., patterned and plated). "Conductive layers" described herein may not extend over an entire surface of an underlying build-up layer. For example, first conductive layer 552 may be selectively formed on top of first build-up layer 548 using a lithography mask that defines a "keep out zone" or "KOZ," to ensure no plating in I/O vias. An example of package assembly 500 at this stage is depicted in FIG. 7. Other conductive layers described herein may also be selectively formed to achieve various electrical routing objectives.

Figure 8:
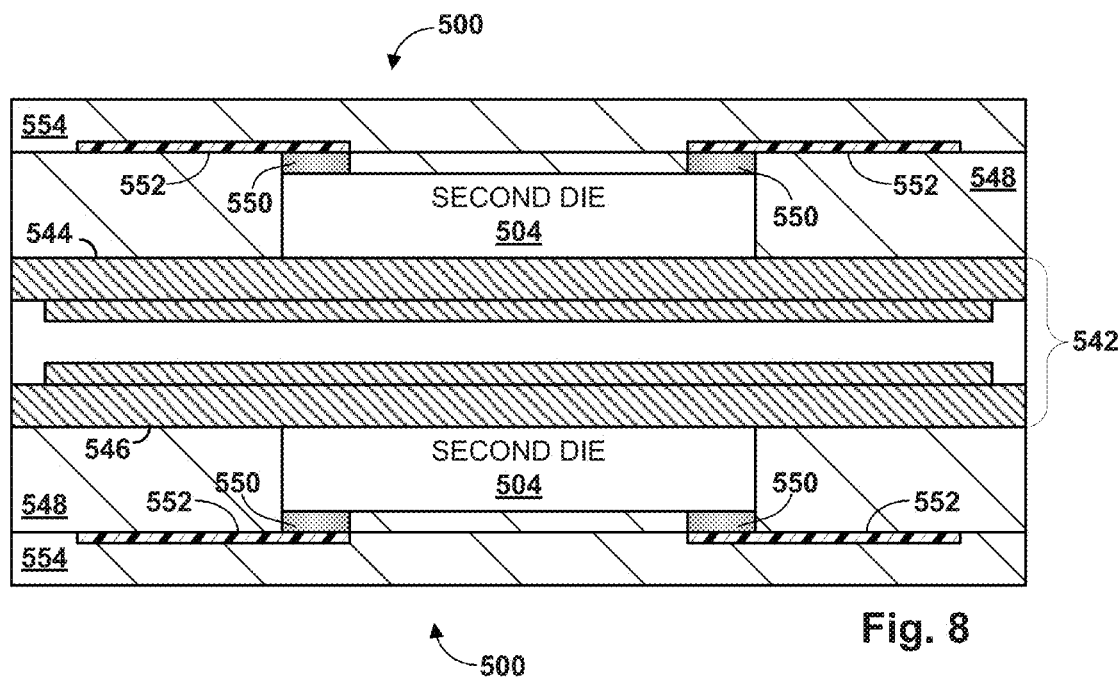
Figure 9:
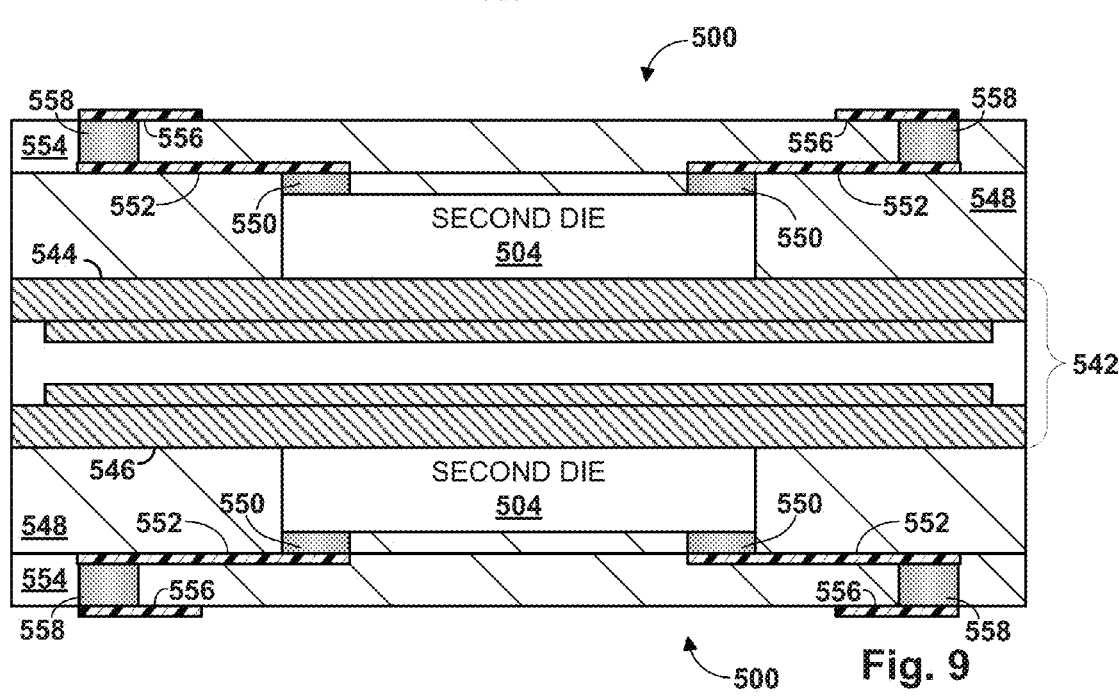
Figure 10:
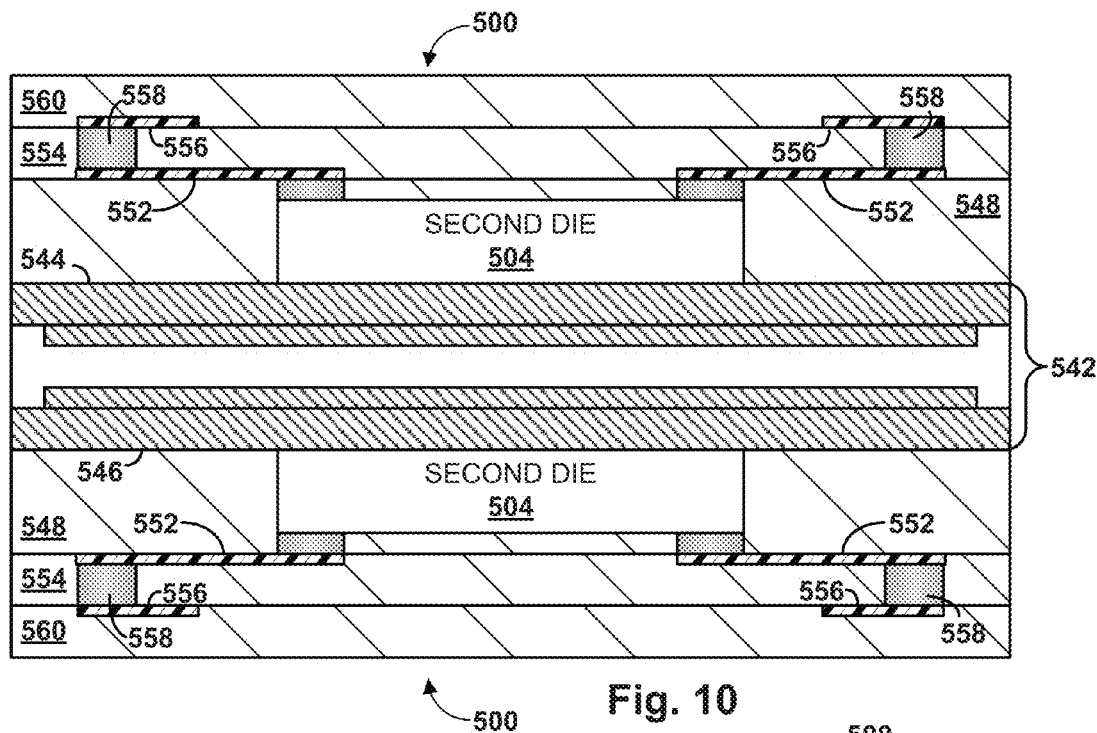

At block 414, a second build-up layer 554, e.g., of ABF laminate, may be formed. An example of package assembly 500 at this stage is depicted in FIG. 8. At block 416, a second conductive layer 556 may be formed (e.g., pattered and plated) on top of second build-up layer 554, with vias 558 passing between second conductive layer 556 and first conductive layer 552. In various embodiments, this second conductive layer 556 may be referred to as an "SL2" layer. An example of package assembly 500 at this stage is depicted in FIG. 9. At block 418, a third build-up layer 560, e.g., of ABF laminate, may be formed. An example of package assembly 500 at this stage is depicted in FIG. 10.

Figure 11:
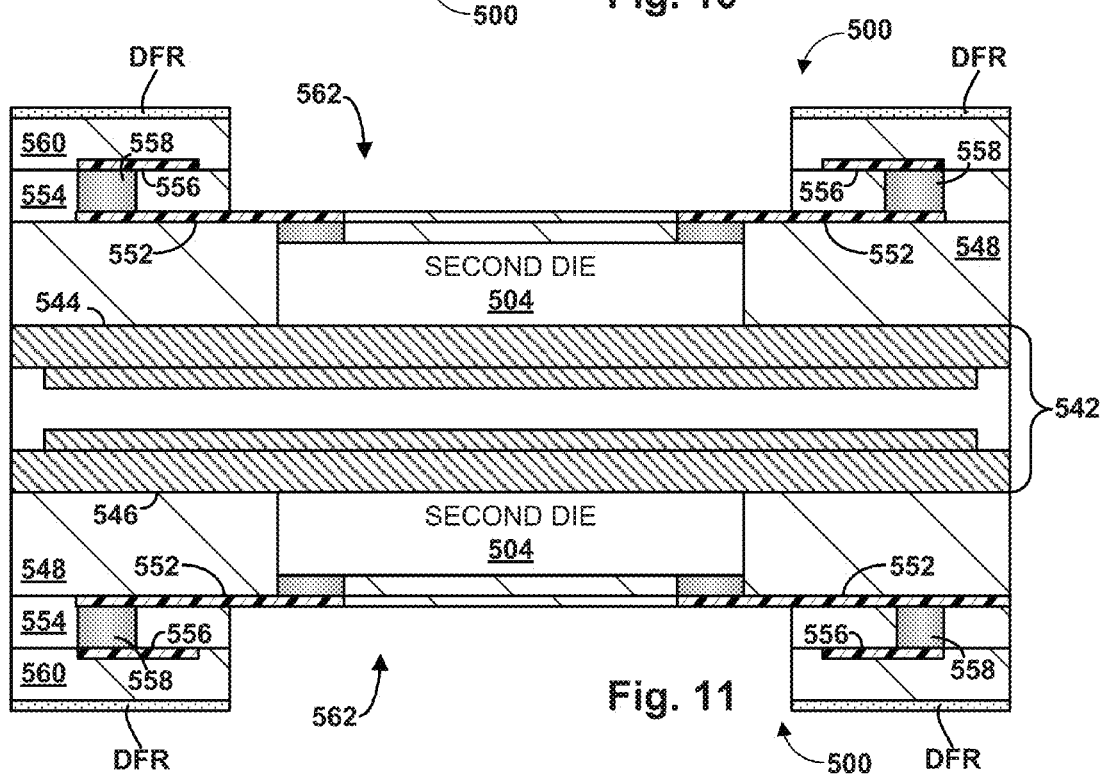

At block 420, a cavity 562 may be formed for receiving primary logic die 502. In various embodiments, photo-definable dry film resist ("DFR") material may be applied first to define where cavity 562 will be located. A wet blast tool may then be used to form cavity 562. ABF laminate may be removed in areas where there is no DFR post develop, e.g., because of a difference in etch rates for DFR versus ABF. In various embodiments, first conductive layer 552, which may be constructed with copper, may serve as an etch stop, because ABF etching may cease once copper is hit. Such technique may preserve a thin slice of second build-up layer 554 between conductive layers 552 on either side. An example of package assembly 500 at this stage is depicted in FIG. 11. In various embodiments, the remaining DFR may be chemically stripped after cavity 562 is formed.

Figures 12, 13:
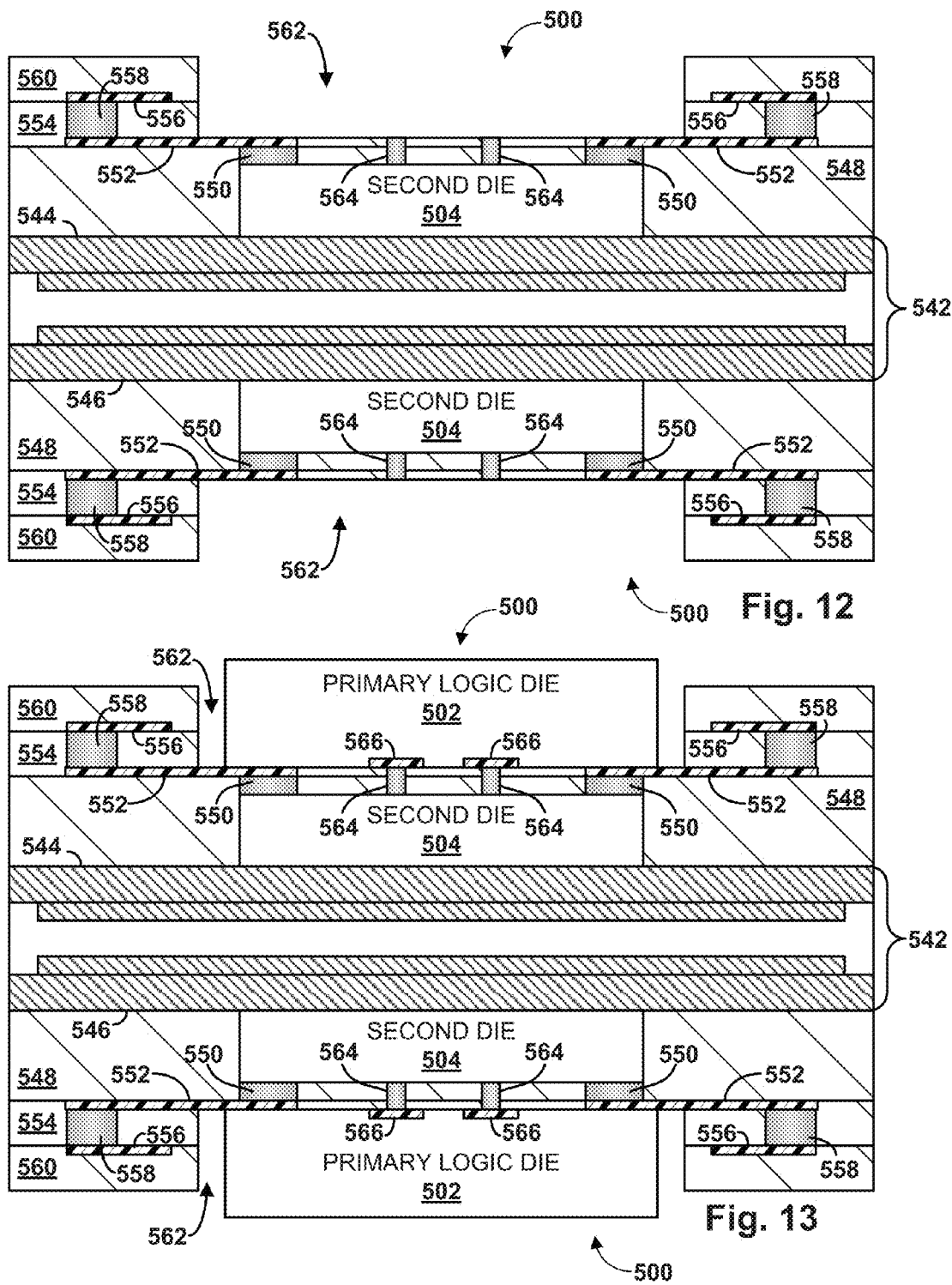

At block 422, vias 564 (referred to herein as logic-logic interconnect vias, or "LLI vias") through what remains of second build-up layer 554 may be formed (e.g., drilled using a laser or other similar means). LLI vias 564 may be used, in some embodiments, to route I/O signals between second die 504 and primary logic die 502. At block 424, LLI vias 564 may be desmeared in order to eliminate residue and for roughening. An example of package assembly 500 at this stage is depicted in FIG. 12.

At block 426, primary logic die 502 may be placed into cavity 562. In various embodiments, solders may be disposed on a surface of primary logic die 502 or paste-printed on second die 504 prior to placement of primary logic die 502. Primary logic die 502 may be heated up so that the solders 566 melt into the LLI vias 564, forming LLI joints and an electrical connection between second die 504 and primary logic die 502. An example of package assembly 500 at this stage is depicted in FIG. 13. In other embodiments, the two die may be bonded differently. For example, anisotropic electrically conductive adhesives, which create electrical connection under pressure, may be employed to bond the two die.

At block 428, a fourth build-up layer 568 of, e.g., ABF laminate, may be formed. In some embodiments, such as the one shown in FIG. 14, primary logic die 502 may be completely embedded. In other embodiments, primary logic die 502 may only be partially embedded.

Figure 14:
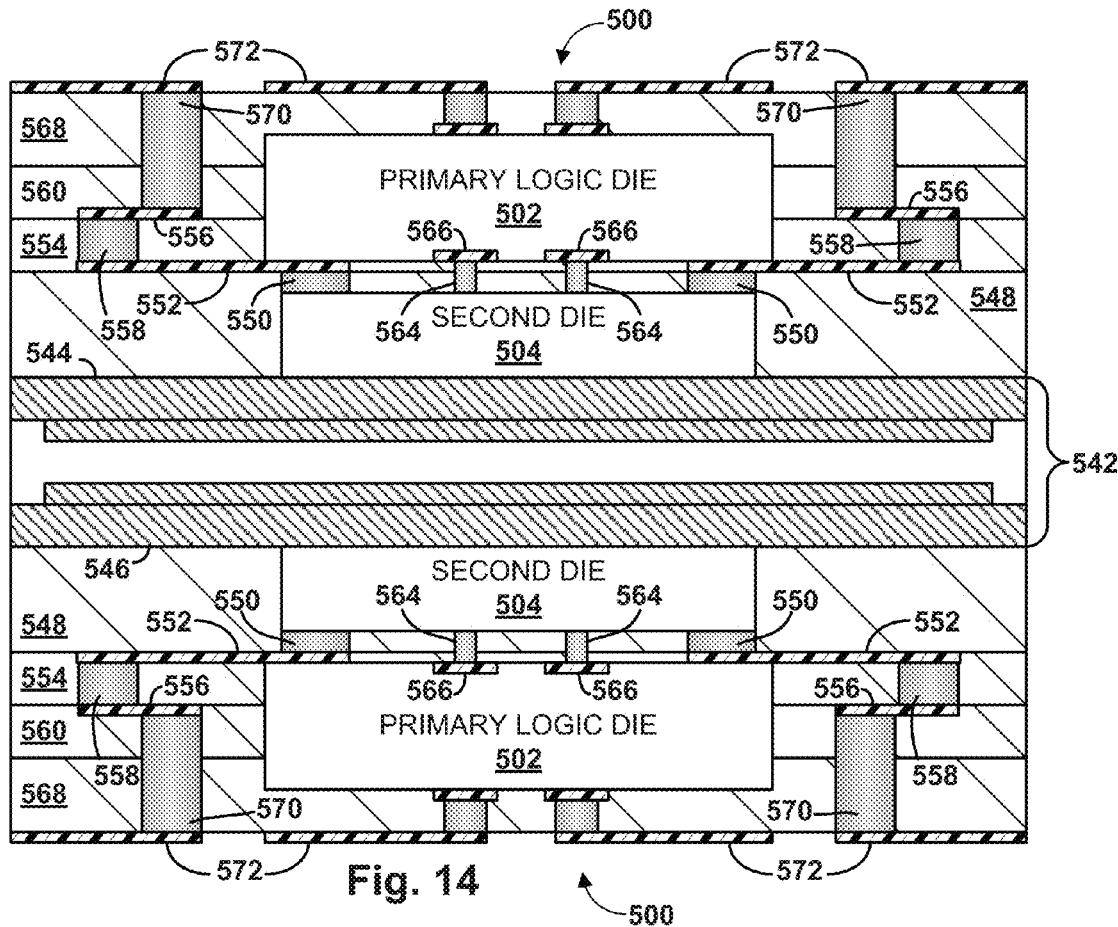

At block 430, vias 570 may be formed from second conductive layer 556 through various build-up layers. For example, and as shown in FIG. 14, vias 570 are formed through fourth build-up layer 568 and third build-up layer 560. In various embodiments, these vias 570 may be referred to as "V0" logic interconnects. In the embodiments shown in FIGS. 5-15, vias 570 are configured to route ground signals and power slightly closer to (although without contacting) primary logic die 502 as they progress towards electrical routing features (not shown in FIGS. 5-15, examples shown in FIGS. 1-3 at 110, 210, 310) disposed on a surface of package assembly 500. In various other embodiments, such as those shown in FIGS. 1 and 2, such vias, and more generally, electrical paths between second die (e.g., 104, 504) or decoupling capacitor 230 and surface routing elements (110, 210) may gradually route away from primary logic die (102, 202, 502).

In various embodiments, vias for routing non-I/O signals such as ground signals and/or electrical power may be formed larger than in traditional package assemblies because they pass through substrate, rather than primary logic die 502. This can be seen in FIGS. 7-15, where vias 550, 558 and 570 (which may correspond to first electrical path 120 in FIG. 1) may be wider than other vias that carry only I/O signals, such as vias 564. TSVs in conventional package assemblies may be approximately ~10-20 μm in diameter. Vias 550, 558, 570, in contrast, may be larger, e.g., 100 μm in some embodiments, depending on the height of the vias and other electrical considerations. Such larger vias may be capable of handling more current and/or power.

At block 432, a third conductive layer 572, which may be referred to as an "L1" layer, may be formed (e.g., patterned and plated) on top of fourth build-up layer 568. An example of package assembly 500 at this stage is depicted in FIG. 14.

Figure 15:
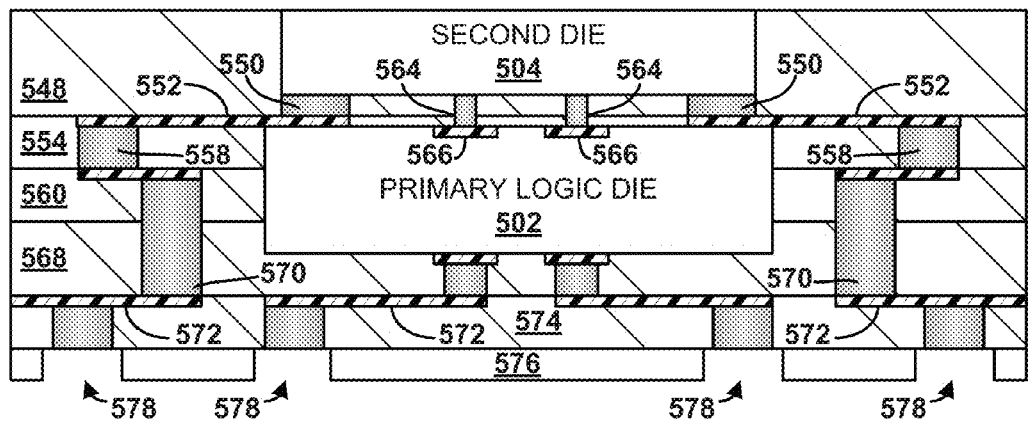

At block 434, subsequent build-up layers (e.g., 574) may be formed. At block 436, copper blank panel 542 may be de-paneled and etched away to create a complete embedded die stack package assembly 500. An example of package assembly 500 at this stage is depicted in FIG. 15. The bottom package assembly 500 is shown removed from blank panel 542. Outermost substrate layer 576 (sometimes referred to as "solder resist layer") with gaps 578 (sometimes referred to as "solder resist openings") may be formed, so that electrical routing features (e.g., 110, 210, 310) such as solder resist balls may inserted therein.

In some embodiments, such as those shown in FIGS. 1-3, both primary logic die (102, 202, 302) and second die (204) or capacitor (230, 330) are fully embedded with plurality of build-up layers (108, 208, 308). However, in other embodiments, such as the one shown in FIG. 15, primary logic die 502 is fully embedded with build-up layers, and second die 504 is embedded so that an inactive surface 574 of second die is flush with (as shown in FIG. 15), or even slightly above, a top surface 576 of package assembly 500.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 16:
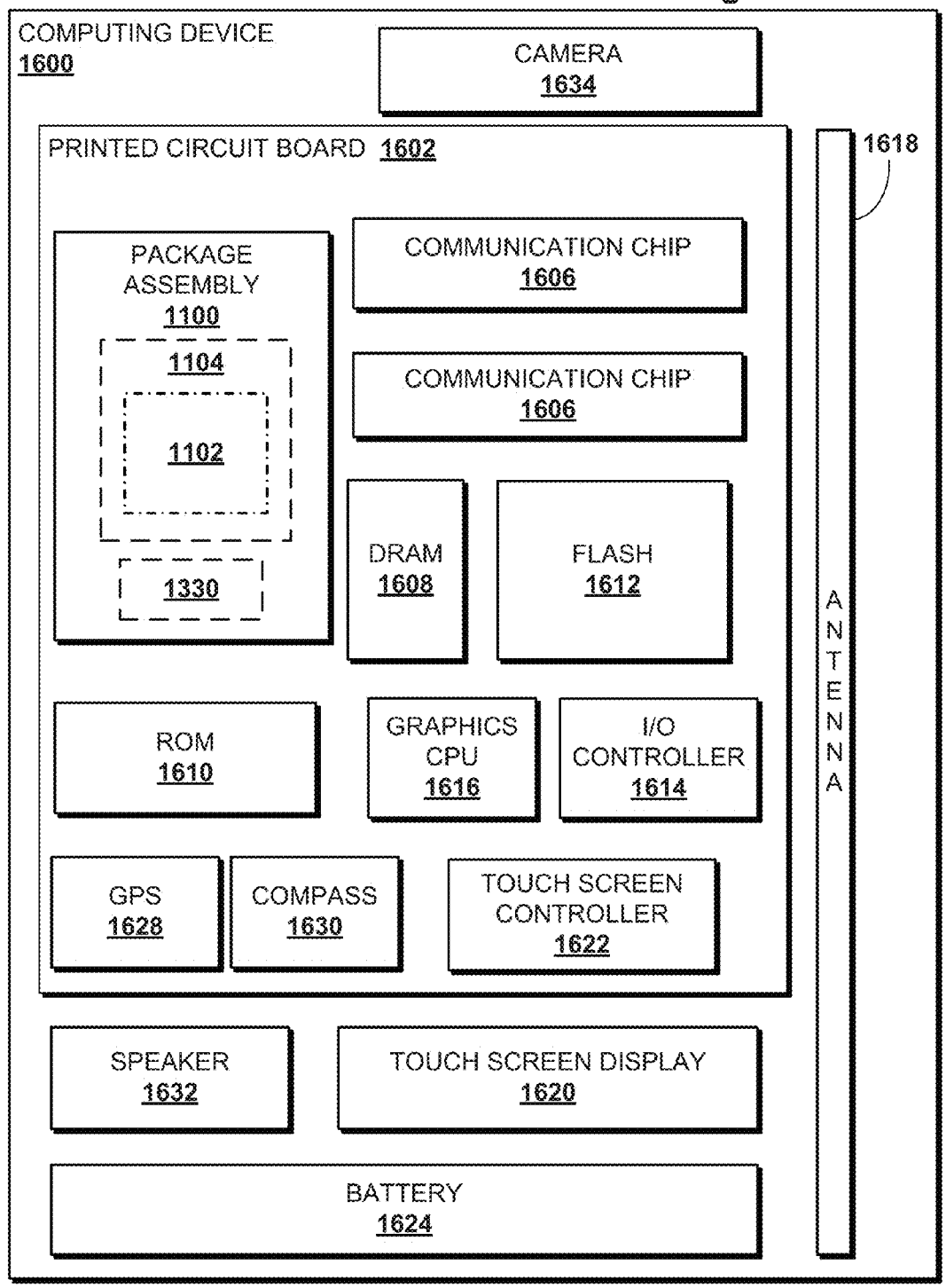
FIG. 16 schematically illustrates a computing device in accordance with one implementation of the invention.

FIG. 16 illustrates an example computing device 1600, in accordance with various embodiments. Package assemblies 100, 200, 300 and 500 as described herein may be installed on a computing device such as computing device 1600. For example, a package assembly 1100, which may include a combination of package assembly 100 of FIG. 1 and package assembly 300 of FIG. 3, is depicted. Package assembly 1110 may include a fully embedded second die 1104, a primary logic die 1102 embedded underneath second die 1104, and decoupling capacitor 1330 embedded and laterally offset from the two die.

In various embodiments, at least one communication chip 1606 may be physically and electrically coupled to package assembly 1100. In further implementations, the communication chip 1606 may be part of package assembly 1100, e.g., as an additional die embedded in build-up layers in package assembly 1100. In various embodiments, computing device 1600 may include PCB 1602. For these embodiments, the package assembly 1100 and communication chip 1606 may be disposed on the PCB 1602. In alternate embodiments, the various components may be coupled without the employment of PCB 1602.

Depending on its applications, computing device 1600 may include other components that may or may not be physically and electrically coupled to the PCB 1602. These other components include, but are not limited to, volatile memory (e.g., dynamic random access memory 1608, also referred to as "DRAM"), non-volatile memory (e.g., read only memory 1610, also referred to as "ROM"), flash memory 1612, an input/output controller 1614, a digital signal processor (not shown), a crypto processor (not shown), a graphics processor 1616, one or more antenna 1618, a display (not shown), a touch screen display 1620, a touch screen controller 1622, a battery 1624, an audio codec (not shown), a video codec (not shown), a global positioning system ("GPS") device 1628, a compass 1630, an accelerometer (not shown), a gyroscope (not shown), a speaker 1632, a camera 1634, and a mass storage device (such as hard disk drive, a solid state drive, compact disk ("CD"), digital versatile disk ("DVD"))(not shown), and so forth. In various embodiments, various components may be integrated with other components to form a System on Chip ("SoC"). In further embodiments, some components, such as DRAM 1608, may be embedded in or within package assembly 1100.

The communication chips 1606 may enable wired and/or wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to IEEE 702.20, General Packet Radio Service ("GPRS"), Evolution Data Optimized ("Ev-DO"), Evolved High Speed Packet Access ("HSPA+"), Evolved High Speed Downlink Packet Access ("HSDPA+"), Evolved High Speed Uplink Packet Access ("HSUPA+"), Global System for Mobile Communications ("GSM"), Enhanced Data rates for GSM Evolution ("EDGE"), Code Division Multiple Access ("CDMA"), Time Division Multiple Access ("TDMA"), Digital Enhanced Cordless Telecommunications ("DECT"), Bluetooth, derivatives thereof, as well as any other wireless protocols that are designated as 3G, 4G, 5G, and beyond. The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

In various implementations, the computing device 1600 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 1600 may be any other electronic device that processes data.

In various embodiments, package assemblies, as well as methods for forming package assemblies and systems incorporating package assemblies, are described herein. A package assembly may include a substrate comprising a plurality of build-up layers, such as BBUL. In various embodiments, electrical routing features may be disposed on an outer surface of the substrate. In various embodiments, a primary logic die and a second die or capacitor may be embedded in the plurality of build-up layers. In various embodiments, an electrical path may be defined in the plurality of build-up layers to route electrical power or a ground signal between the second die or capacitor and the electrical routing features, bypassing the primary logic die.

In various embodiments, the second die or capacitor may be a secondary logic die or a memory die. In various embodiments, the primary logic die may include one or more vias between a first surface of the primary logic die and a second, opposing surface of the primary logic die. In various embodiments, the electrical path is a first electrical path, the package assembly may further include a second electrical path defined in the plurality of build-up layers from an active surface of the secondary logic die or memory die to the one or more vias, to route I/O signals between the primary logic die and the secondary logic die or memory die. In various embodiments, the second die or capacitor may be a power management die.

In various embodiments, the first die and the second die or capacitor may be fully embedded within the plurality of build-up layers. In various embodiments, the outer surface of the substrate may be a first outer surface, the first die may be fully embedded within the plurality of build-up layers, and a surface of the second die may be flush with a second outer surface of the substrate opposite the first outer surface. In various embodiments, the primary logic die and the second die or capacitor may be approximately coplanar. In various embodiments, the primary logic die may be embedded in the plurality of build-up layers in-between the second die or capacitor and the electrical routing features.

In various embodiments, the electrical path may include a conductive layer between two of the plurality of build-up layers to route the electrical power or ground signal that passes between the second die and the electrical routing features away from the primary logic die. In various embodiments, the conductive layer may be a first conductive layer, and the electrical path may include a second conductive layer between two of the plurality of build-up layers. In various embodiments, the second conductive layer may be parallel to the first conductive layer and closer to the electrical routing features than the first conductive layer.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method of producing a package assembly, comprising:
    forming a plurality of build-up layers comprising a bumpless build-up layer (BBUL) substrate;
    disposing one or more electrical routing features on an outer surface of the plurality of build-up layers comprising the substrate;
    embedding a first die comprising a primary logic die in the plurality of build-up layers, the primary logic die including one or more through-silicon vias between a first surface of the primary logic die and a second surface of the primary logic die that is opposite to the first surface;
    embedding a second die in the plurality of build-up layers;
    forming a first electrical path in the plurality of build-up layers between the second die and the electrical routing features, the first electrical path to route power or ground, including providing the first electrical path to avoid contact with the first surface of the primary logic die;
    forming a second electrical path in the plurality of build-up layers from an active surface of the second die to the one or more through-silicon vias of the primary logic die, the second electrical path to route input/output (I/O) signals;
    forming a third electrical path in the plurality of build-up layers from the first surface of the primary logic die to the electrical routing features, the third electrical path to route I/O signals between the primary logic die and the electrical routing features, and the third electrical path to route power or ground between the primary logic die and the electrical routing features;
    disposing a conductive layer between first and second build-up layers of the plurality of build-up layers, the conductive layer to fan out away from the primary logic die, wherein disposing the conductive layer includes directly physically coupling a portion of the conductive layer with the second surface of the primary logic die, wherein the first electrical path includes the portion of the conductive layer, wherein embedding the first die includes providing the primary logic die in the first build-up layer between the second die and the electrical routing features, and embedding the second die includes providing the second die in the second build-up layer, the first build-up layer being in contact with the second build-up layer; forming a plurality of vias in respective laminate layers of the BBUL substrate, such that a first via of the plurality of vias is offset from a second via of the plurality of vias in a direction parallel to the first surface of the primary logic die, wherein the first electrical path further includes the plurality of vias; and
    forming an interconnect via formed by laser drilling through the second build-up layer toward the second die, the interconnect via directly coupling the primary logic die and the second die and the second electrical path entirely disposed between the primary logic die and the second die, wherein the second electrical path includes the interconnect via.

2. The method of claim 1, wherein the second die comprises a power management die.

3. The method of claim 2, wherein the conductive layer is a first conductive layer, wherein the method further includes forming a second conductive layer between the first build-up layer and a third build-up layer of the plurality of build-up layers, and wherein the second conductive layer is parallel to the first conductive layer and closer to the electrical routing features than the first conductive layer, and wherein the first-build-up layer is in direct contact with the third build-up layer, wherein the first electrical path further includes the second conductive layer.

4. The method of claim 1, wherein the second die comprises a secondary logic die or a memory die.

5. The method of claim 1, wherein forming the one or more electrical routing features includes forming solder interconnect structures on the surface of the plurality of build-up layers.

6. The method of claim 1, wherein the primary logic die and the second die are fully embedded within the plurality of build-up layers.

7. The method of claim 6, wherein the outer surface of the substrate is a first outer surface, wherein embedding the first die includes fully embedding the primary logic die within the plurality of build-up layers, wherein a surface of the second die is flush with a second outer surface of the substrate that is disposed opposite the first outer surface.

8. The method of claim 1, wherein the method further comprises:
    forming a through silicon via (TSV) through the primary logic die, the TSV extending from a first side of the primary logic die to a second side of the primary logic die, the second side being opposite from the first side, wherein the TSV is coupled to the second via;
    forming a third via from the second side of the primary logic die to a second conductive layer within the plurality of build-up layers, the second conductive layer being located on an opposite side of the primary logic die from the second die or the capacitor and the third via coupled to the TSV; and forming a second electrical path through the second via, the TSV, and the third via, wherein the second electrical path routes signals from the primary logic die to the second conductive layer.

9. The method of claim 8, wherein widths of a plurality of vias through which the first electrical path is routed are wider than a width of the TSV.

10. The method of claim 8, wherein the first electrical path is to route electrical power or a ground signal between the second die or a capacitor and the one or more electrical routing features.

11. The method of claim 8, wherein the second electrical path is to route input/output signals between the primary logic die and the second die or a capacitor.

12. The method of claim 1, wherein embedding the first die includes:
    forming a cavity within at least one build-up layer of the plurality of build-up layers;
    placing the primary logic die within the cavity; and
    forming an additional build-up layer of the plurality of build-up layers on the primary logic die, the additional build-up layer to fill the cavity and embed the primary logic die within the plurality of build-up layers.

13. The method of claim 12, wherein forming the cavity includes:
    applying a photo-definable dry film resist material to a surface of the at least one build-up layer; and
    removing a first portion of the at least one build-up layer with a wet blast tool, wherein the photo-definable dry film resist material protects a second portion of the at least one build-up layer from removal by the wet blast tool.

14. The method of claim 12, wherein the cavity abuts a first conductive layer, and wherein the primary logic die is placed and embedded with an inactive surface of the primary logic die in contact with the first conductive layer.

15. The method of claim 1, wherein the first surface of the primary logic die is an inactive surface of the primary logic die, and wherein the second surface of the primary logic die is an active surface of the primary logic die.

* * * * *